United States Patent [19]

Beilein et al.

[11] 4,096,983
[45] Jun. 27, 1978

[54] BONDING COPPER LEADS TO GOLD FILM COATINGS ON ALUMINA CERAMIC SUBSTRATE

[75] Inventors: Loraine F. Beilein, Pinellas Park; Frank S. Burkett, Jr., Seminole, both of Fla.

[73] Assignee: E-Systems, Inc., Dallas, Tex.

[21] Appl. No.: 786,389

[22] Filed: Apr. 11, 1977

[51] Int. Cl.² ............................................. B23K 31/02
[52] U.S. Cl. .................................. 228/122; 228/159; 228/179; 228/254; 228/904
[58] Field of Search ............... 228/122, 123, 159, 160, 228/175, 179, 4.5, 904, 245, 246, 254, 208, 263

[56] References Cited

U.S. PATENT DOCUMENTS

| | | | |
|---|---|---|---|
| 3,159,462 | 12/1964 | Kadelburg | 228/122 X |
| 3,273,979 | 9/1966 | Budnick | 228/122 X |
| 3,296,692 | 1/1967 | Griffin | 228/122 |
| 3,593,412 | 7/1971 | Foote | 228/209 X |
| 3,662,454 | 5/1972 | Miller | 228/904 X |
| 3,839,780 | 10/1974 | Freedman | 228/249 |
| 3,986,255 | 10/1976 | Mandal | 228/245 X |

*Primary Examiner*—Donald G. Kelly
*Attorney, Agent, or Firm*—Robert V. Wilder

[57] ABSTRACT

A process for thermocompression bonding a copper wire lead to gold film on alumina ceramic substrate by use of a gold interface. The three step process involves: (1) thermocompressing a gold lead with a die-formed head to the gold film, (2) removing the gold lead to form a gold die-formed head bonding pad, and (3) thermocompressing the copper lead to the gold die-formed head bonding pad.

8 Claims, 3 Drawing Figures

BONDING COPPER LEADS TO GOLD FILM COATINGS ON ALUMINA CERAMIC SUBSTRATE

BACKGROUND

This invention relates to the manufacture of hybrid circuits and more particularly to a process for bonding copper wire leads to gold films on alumina ceramic substrates. In the past such bonding has been accomplished by the use of gold wires or ribbons that were more difficult and expensive to use.

A search of the prior art has revealed the following related patents: U.S. Pat. Nos. 3,296,692 to Griffin; 3,593,412 to Foote; 3,839,780 to Freedman and Vogelsang; and 3,986,255 to Mandal.

Heretofore, many methods have been disclosed for attaching copper wire leads to film coatings of aluminum or titanium vapor deposited on quartz crystals. One such method utilizes thermocompression to achieve bonding, but does not involve the use of a gold interface. This method fails when dealing with gold film coatings on alumina ceramic substrates because the gold film blisters if the copper wire lead is thermocompressed directly to it.

Another earlier method of bonding a semiconductor device to a metal substrate utilizes the deposition of a gold solder preform onto the device and coating the metal substrate with a first layer of gold, a second layer of silver and a third layer of gold. The device is bonded to the substrate by heating the substrate to an elevated temperature and placing the gold preform on top of the third gold layer.

Another earlier method bonds metal surfaces by the use of an intermetallic compound. This method requires the formation of an intermetallic intermediate and does not utilize thermocompression in the bonding process.

Still another process for interconnecting electronic chips uses gold alloy bumps containing layers of magnetic metals. Bonding is accomplished by melting the bumps, causing them to flow to the substrate surface by magnetic attraction.

None of the presently known processes discloses a workable method of attaching copper wire leads to a gold film on an alumina ceramic substrate by the use of thermocompression. Such a method is disclosed herein.

SUMMARY OF THE INVENTION

The present invention provides an improved method of bonding coil and transformer lead wires to gold films on alumina ceramic substrates using standard microelectronic hybrid equipment. This method utilizes less expensive, more standardized parts than the gold wires or ribbons previously required to interface between components and gold films.

The process of the present invention is performed in three separate and distinct steps. In the first, a gold lead with a die-formed head is thermocompression bonded to a gold film on an alumina ceramic substrate. In the second, the gold lead is removed to form a single gold die-formed head bonding pad. In the third, a copper wire lead is thermocompression bonded to the gold die-formed head bonding pad.

DETAILED DESCRIPTION OF THE INVENTION

Other advantages of the present invention will be apparent from the following detailed description. Reference is made to the accompanying drawings wherein.

Figure 1:
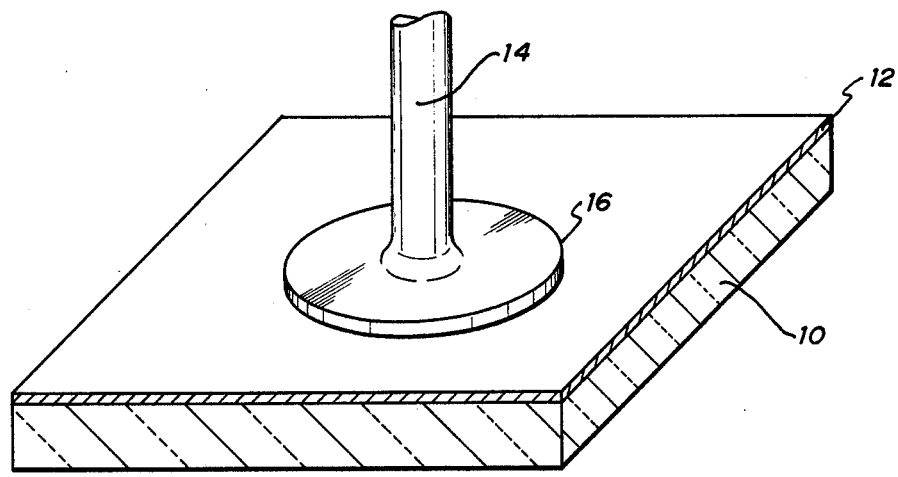
FIG. 1 depicts a small section of alumina ceramic substrate coated with a gold film to which a gold die-formed head bonding pad with attached lead wire has been thermocompressed.

FIG. 1 illustrates a small portion of an alumina ceramic substrate 10 coated with a gold film 12. For purposes of this invention, the gold film can be plated onto the substrate, vapor deposited, or applied as a thick film paste. Vapor deposition processes well known in the industry may include vacuum evaporation, cathode sputtering and chemical vapor deposition. When applied as a thick film paste, the gold coating is fired onto the substrate at temperatures around 1100° C.

In the first step of the process for bonding a copper lead to the gold film 12, a gold lead wire 14 with a die-formed head bonding pad 16 is thermocompressed onto the gold film 12. Thermocompression is accomplished by the use of a thermocompression ball bonding machine of the type well known in the industry with a 0.001 inch capillary bonder tip heated to 250° C. The diameter of the gold lead wire 14 is 0.001 inches. In the second step of the process, the gold lead wire 14 is removed from the gold die-formed head bonding pad 16 by the use of tweezers.

Figure 2:
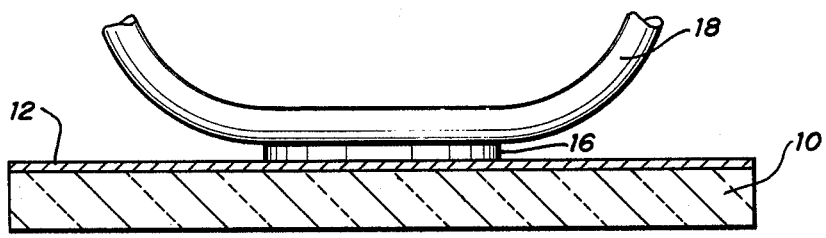
FIG. 2 depicts the front view of the coated substrate wherein the gold lead wire has been detached from the gold die-formed head bonding pad, and a copper wire has been thermocompressed thereto.

The third step of the process is illustrated by reference to FIG. 2, showing the front view of a copper wire 18 bonded to the gold die-formed head bonding pad 16 on the surface of the gold film 12 coating the substrate 10. Bonding is accomplished by thermocompressing the copper wire 18 onto the gold die-formed head bonding pad 16 by the use of a 0.001 inch capillary bonder tip heated to 250° C. Thermocompression of the copper wire 18 to the gold die-formed head bonding pad 16 results in a bond between the copper wire and the gold film 12 with a gold interface in between. Insulation was stripped from the copper wire 18 just prior to bonding to insure that the wire would be clean.

Figure 3:
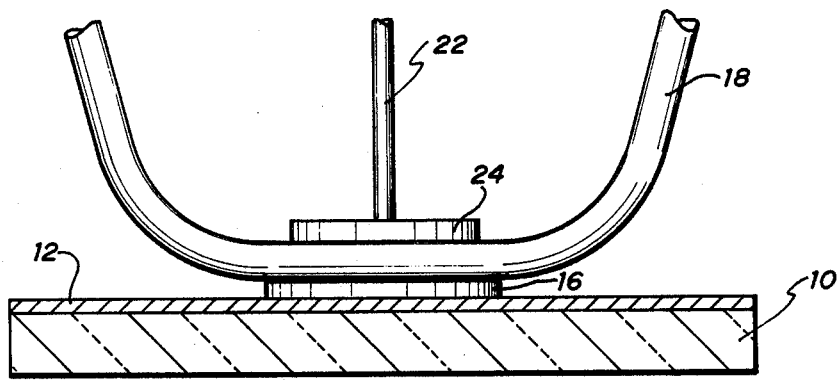
FIG. 3 depicts another gold die-formed head thermocompressed to the copper wire of FIG. 2.

Bonding was attempted at various compressive forces and stage temperatures, both with and without the use of the gold bonding pad taught by this invention. The quality of bonds formed in those tests is recorded in Tables 1-3 according to the substrate used. Bond quality is classified in the tables as either "good" or "poor" based upon the following test procedures, illustrated in part by FIG. 3.

A second gold lead wire 22 with a die-formed head 24 was thermocompressed onto the copper wire 18 that had been previously bonded to the gold die-formed head bonding pad 16 according to the present invention. A pulling force was then applied to the gold lead wire 22 to see whether the copper wire 18 could be pulled away from the gold die-formed head bonding pad 16 previously bonded to the gold film 12 on the substrate 10. If, instead, the gold lead wire 22 broke away from the gold die-formed head 24 when pulled, a second test was performed. In the second test, the ends of the copper wire 18 were pulled in an effort to detach them from the gold die-formed head bonding pad 16 or the gold film 12 on the surface of the substrate 10. If the bond formed between the copper wire 18 and the gold film 12 failed when the ends of the wire were pulled, then the bond quality was described as poor. If, on the other hand, the ends of the copper wire 18 broke at the edge of the gold die-formed head bonding pad 16 when pulled, the bond quality was described as good. For those cases where no bonding pad was used, the testing procedure was identical except that there was no gold interface between the copper wire 18 and the gold film 12.

The copper wire 18 used in the above tests had a diameter of 0.002 inches. Copper wire with a diameter of 0.004 inches was also tested, but was considered too large. As the tables indicate, some attempts were also made using a gold plated copper wire of the same diameter.

Recorded in Table 1 are the results from bonding performed on a glazed substrate with a vapor deposited gold coating. The compressive force was varied from 420 to 520 grams and the stage temperature from 100° to 200° C. Good quality bonds were achieved according to the process of the present invention with both the copper and gold plated wire over the entire range of stage temperatures and compressive forces. Conversely, the quality of bonds attempted without the use of the gold interface was poor.

TABLE 1

Glazed Substrate

| Compressive Force (Grams) | Stage Temp. (Degrees C) | Bonding Pad Used? | Gold Plated Copper Wire? | Bond Quality |
| --- | --- | --- | --- | --- |
| 420 | 125 | No | Yes | Poor |
| 520 | 125 | No | Yes | Poor |
| 420 | 125 | Yes | Yes | Good |
| 420 | 100 | Yes | No | Good |
| 520 | 100 | Yes | No | Good |
| 420 | 150 | Yes | No | Good |
| 520 | 150 | Yes | No | Good |
| 420 | 200 | Yes | No | Good |
| 520 | 200 | Yes | No | Good |

Recorded in Table 2 are the results of bonding both plated and unplated copper wire to an unglazed substrate with a vapor deposited gold coating. Compressive force was again varied from 420 to 520 grams and stage temperature from 100° to 200° C. The results show that good quality bonds were achieved with a compressive force of 520 grams and a stage temperature of 200° C when using a bare copper wire in accordance with the process of the present invention. Good quality bonds were achieved at a temperature of 100° C. by the use of a gold plated copper wire. In no instances were good quality bonds achieved without the use of a gold interface.

TABLE 2

Unglazed Substrate

| Compressive Force (Grams) | Stage Temp. (Degrees C) | Bonding Pad Used? | Gold Plated Copper Wire? | Bond Quality |
| --- | --- | --- | --- | --- |
| 520 | 200 | No | No | Poor |
| 420 | 100 | Yes | Yes | Poor |
| 520 | 100 | Yes | Yes | Good |
| 420 | 125 | Yes | No | Poor |
| 520 | 125 | Yes | No | Poor |
| 420 | 150 | Yes | No | Poor |
| 420 | 200 | Yes | No | Poor |
| 520 | 200 | Yes | No | Good |

Recorded in Table 3 are the results of bonding both plated and unplated copper wire to an alumina ceramic substrate having a plated-up, as opposed to vapor deposited, gold film coating. Bonds were made over compressive forces ranging from 420 to 700 grams and stage temperatures from 100° to 200° C. Good quality bonds were achieved at a stage temperature of 200° C. over compressive forces ranging from 420 to 520 grams when a gold plated copper wire was used. No good quality bonds were achieved without the use of the gold interface. At compressive forces greater than 520 grams, the copper wire was pinched in two during thermocompression by the bonding tip.

TABLE 3

Plated-Up Film

| Compressive Force (Grams) | Stage Temp. (Degrees C) | Bonding Pad Used? | Gold Plated Copper Wire? | Bond Quality |
| --- | --- | --- | --- | --- |
| 600 | 125 | Yes | No | Poor |
| 420 | 150 | Yes | No | Poor |
| 700 | 150 | Yes | No | Poor |
| 420 | 200 | Yes | No | Poor |
| 420 | 200 | No | No | Poor |
| 520 | 200 | No | No | Poor |
| 420 | 100 | No | Yes | Poor |
| 520 | 150 | No | Yes | Poor |
| 420 | 200 | No | Yes | Poor |
| 520 | 100 | Yes | Yes | Poor |
| 420 | 150 | Yes | Yes | Poor |
| 420 | 200 | Yes | Yes | Good |
| 520 | 200 | Yes | Yes | Good |

In some instances where bonding was attempted without the use of a bonding pad as taught herein, no actual bond was formed because there was no adhesion of the copper wire to the gold film on the substrate surface. Bond quality in those cases was reported as poor in Tables 1–3. In those situations where adhesion did occur between the copper wire and the gold film without the use of a gold die-formed head bonding pad to serve as an interface, the bond quality was still poor. In some cases the stage temperatures required to achieve adhesion would cause the thin gold film to blister. In others, the gold film would pull away from the surface of the substrate when the bond was tested. When attempts were made to bond the copper wire directly to a gold thick film paste containing glass frits, the frits fractured, resulting in poor quality bonds. In each case these difficulties could be overcome through the use of a gold interface in accordance with the present invention.

Attempts to bond the copper wire leads directly to the coated substrate resulted in poor quality bonds in all cases, whether or not the copper wire was gold plated. In bonding to a plated-up gold film, good quality bonds were only achieved by using gold plated copper wire and a stage temperature of 200° C. The best and most consistent bonds at different temperatures and compressive forces were achieved by bonding to a glazed substrate with a vapor deposited gold film.

It will be understood that modifications indicated above and others not mentioned may be made by those skilled in the art without depending from the spirit and scope of the claimed invention.

We claim:

1. A process for bonding copper wire leads to gold films on alumina ceramic substrates, comprising the steps of:
    (a) forming a gold die-formed head bonding pad on the gold film by thermocompressing a gold lead wire with a gold die-formed head to the gold film;
    (b) removing the gold lead wire; and
    (c) thermocompressing a copper wire to the gold die-formed head bonding pad forming a bond between the copper wire and the gold film with a gold interface in between.

2. The process described in claim 1 wherein the gold film is vapor deposited.

3. The process described in claim 1 wherein the gold film is plated-up.

4. The process described in claim 1 wherein the gold film is applied as a thick film paste and fired onto the alumina ceramic substrate.

5. The process described in claim 1 wherein the alumina ceramic substrate is glazed.

6. The process described in claim 1 wherein the thermocompression bonds are formed at stage temperatures ranging from 100° to 200° C.

7. The process described in claim 1 wherein the thermocompression bonds are formed at compressive forces ranging from 420 to 520 grams.

8. The process described in claim 1 wherein the copper wire lead is gold plated.

* * * * *